United States Patent [19]

Schramm et al.

[11] 4,008,398

[45] Feb. 15, 1977

[54] TRANSDUCER SIGNAL CONDITIONING CIRCUIT

[76] Inventors: Benjamin B. Schramm, 426 Dallas Drive, Campbell, Calif. 95008; Alan M. Paul, 3031 Bryant St., Palo Alto, Calif. 94306

[22] Filed: Nov. 19, 1975

[21] Appl. No.: 633,438

Related U.S. Application Data

[62] Division of Ser. No. 449,842, March 11, 1974, abandoned.

[52] U.S. Cl. ............................... 250/372; 328/127
[51] Int. Cl.² ....................................... G01J 1/42
[58] Field of Search ........................... 250/372, 373 328/127

[56] References Cited

UNITED STATES PATENTS

| | | |
|---|---|---|
| 3,415,984 | 12/1968 | Frungel ............................... 250/372 |
| 3,504,267 | 3/1970 | James et al. ..................... 328/127 X |
| 3,825,760 | 7/1974 | Fletcher ............................. 250/372 |
| 3,917,948 | 11/1975 | Strutz ................................. 250/372 |

*Primary Examiner*—Archie R. Borchelt
*Attorney, Agent, or Firm*—C. Michael Zimmerman

[57] ABSTRACT

A circuit for continuously monitoring or determining the magnitude of a resistance, capacitance, inductance, voltage or current over a very large dynamic range by means of a signal-to-pulse-train converter, rather than by conventional linear amplification techniques. The circuit in part, comprises a resistance, current or voltage source, and a reactive element. The reactive element is discharged from the power source to operate a temperature insensitive trigger circuit that, in turn, actuates a semiconductor switch recharging the reactive element. The frequency or period of operation is a preselected function of the variable parameter to be determined, as of a transducer.

5 Claims, 4 Drawing Figures

TRANSDUCER SIGNAL CONDITIONING CIRCUIT

This is a division of application Ser. No. 449,842, filed Mar. 11, 1974, now abandoned.

BACKGROUND OF INVENTION

Although the present invention is equally applicable to the determination of resistance, inductance or capacitance and may be employed in a wide variety of applications, the following description of the present invention and reference to background of invention is primarily directed to the field of ultraviolet light intensity measurement employing a very high resistance transducer.

In the field of water purification and contamination measurement, it is conventional to employ a system incorporating an ultraviolet light source with an ultraviolet light detector spaced therefrom by a liquid. The function of the detector is to measure or monitor the ultraviolet light intensity illuminating the medium. Sensing of ultraviolet light intensity is accomplished with a transducer and, for commercial applications, it is important to minimize the cost and maximize the reliability of such a transducer while at the same time ensuring that it is only ultraviolet light that is being measured. There has been developed an ultraviolet light sensor which is responsive substantially to ultraviolet light and which is also relatively inexpensive. A difficulty with employing this type of sensor is the very high resistance of the sensor. The resistance of the sensor varies inversely with intensity of incident ultraviolet light and may typically vary in the range of 0.1 megohms to 1,000 megohms.

In general, resistance, as of transducers, sensors, or the like, is measured by applying a voltage across or current through the device and measuring the current flow or voltage drop, with the resistance then being determined as the quotient of the voltage-to-current. In order to achieve reliability in the measuring circuitry, it is desired to employ solid state circuitry; however, in the resistance range of interest herein, a linear amplifier having a discrete input transistor will have the leakage current or offset voltage of the same order of magnitude as the signal level to be determined, so that accurate measurement is not possible. It has been proposed to employ field effect transistors which have an extremely high input impedence and, consequently, low leakage current. However, for linear amplification of dc voltages, filed effect transistors exhibit two basis modes of instability: (a) they are temperature sensitive with respect to bias; and (b) the operational parameters vary considerably from manufacturing lot to lot. Compensation for these instabilities for linear amplification of dc voltages is generally impractical.

It is also noted that various sensors, including the one briefly commented upon above, have a hyperbolic signal response. Consequently, conventional linear measuring systems produce an output which is generally impractical to utilize because of dynamic range and/or sensitivity limitations.

The present invention provides a measuring circuit for monitoring, for example, very small variations over a large dynamic range of resistance without employing linear current amplification and having a circuit configuration intrinsically providing a matched hyperbolic signal response such that utilization of same with a transducer or circuit element (as mentioned above) produces a linear output.

SUMMARY OF INVENTION

The present invention relates to an electronic circuit whose characteristic response to an input signal enables the user to determine or monitor the paratmeters of a transducer or other signal source under conditions where conventional linear amplification techniques would prove unusable or impractical with respect to noise, dynamic range, and/or non-linear source signals. The circuit may be used in conjunction with processor or calculator circuitry (digital or analog) to provide signal linearization, expansion, or compression from a significant number of families of transducers or other signal generating components.

The circuit generates intrinsic closed-loop feedback by utilizing the signal source as a "building-block" element, thereby eliminating the necessity of external control circuitry (with their inherent delays and errors) such as reference clocks, timers, counters, calibrated current sources, threshold detectors, and the like.

The output of the signal conditioning circuit is a pulse train whose frequency is a function of the signal source: by measuring the frequency, duty cycle or period of the output with an associated processor or calculator, conversion of the input signal (resistance, capacitance, inductance, voltage, or current) to a usable form is readily achieved. An example of the circuit's application might be the direct conversion of the non-linear resistive response of a particular family of transducers to a linear frequency output, or the expansion of a linear voltage source signal to a hyperbolic frequency response, providing increased sensitivity to minute signal fluctuations.

Depending on the nature of the readout required by the user, the input signal may be preconditioned by conventional circuitry before coupling to the signal injection point, as with voltage or current signals, or directly married to the circuit loop, as with resistance, capacitances, or inductances. The intrinsic loop-generated pulse or period rate may be made linear, hyperbolic, or logarithmic in nature, dependent on measurement requirements, of dynamic range, sensitivity, characteristic sensor response, and processor format.

The present invention is particularly applicable to the measurement of ultraviolet light intensity. Such a system utilizes a high resistance sensor having a hyperbolic resistancevs. -intensity response described previously.

The circuit described herein utilizes the sensor to discharge a capacitor connected in series with it. The circuit senses when the capacitor is fully discharged by the use of a differential comparator, at which time the capacitor is instantaneously recharged to a predetermined voltage and the cycle begins again. In effect then, the capacitor is periodically discharged through the resistance of the sensor at a rate determined by the R-C time constant of the sensor-capacitor network. Each time the differential comparator senses a predetermined voltage threshold level (in this case, zero volts), an output pulse is generated by the pulse conditioning portion of the network. The repetition rate of the periodically discharging capacitor and consequent pulse train output is a measure of the value of the resistance of the sensor. The present invention provides for counting the output pulse rate from the pulse conditioning network to determine the sensor resistance and thus the ultraviolet light intensity.

In order to eliminate any error generated by the response of the sensor to visible light, there may be employed a second sensing circuit, sensitive only to visible light. The counted output therefrom is subtracted from the counted output of the ultraviolet sensor circuit which is sensitive to all impinging radiation, to produce a net readout which is a function of the ultraviolet light intensity only.

It will be appreciated that the present invention does not employ linear current amplification for measurement of resistance and thus various above-noted problems associated with conventional means for monitoring a high value variable resistance are entirely precluded herein.

A salient feature of this invention is that it converts an amplitude varying signal into a time varying signal whose output is linear with respect to the ultraviolet light intensity, i.e. it linearizes the sensor's hyperbolic signal response characteristic, $R = K_1/\text{Intensity}$.

DESCRIPTION OF FIGURES

The present invention is illustrated as to a single preferred embodiment thereof and particular application of the invention in the accompanying drawings wherein.

DESCRIPTION OF PREFERRED EMBODIMENT

Figure 1:
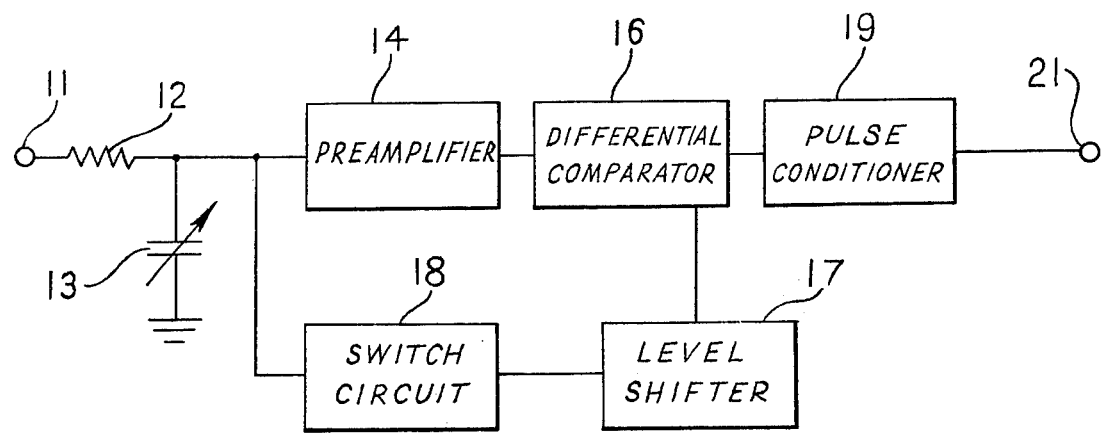
FIG. 1 is a block diagram of a circuit in accordance with the present invention.

The present invention is illustrated in block diagram form in FIG. 1 of the drawings and, referring thereto, there will be seen to be provided a power supply terminal 11 connected to one end of a high value variable resistance 12. The resistor 12 is grounded through a variable capacitor 13 and, assuming that the power supply connected to terminal 11 has a ground return to the circuit, the power supply will be seen to be connected across a series RC circuit. It is also noted that the resistance and capacitance are stated above to both be variable; however, in operation one of these has an invariable value. Taking the example of measuring or monitoring the resistance of the resistor 12 with a fixed capacitor 13, it is noted that the capacitor 13 will be discharged by a current flowing through the resistor 12, with the rate of capacitor discharge being determined by the RC constant of the elements 12 and 13. The present invention includes a preamplifier circuit 14 having an input connected to the junction of the resistor 12 and capacitor 13 and operable to produce an output voltage signal which tracks the voltage across the capacitor 13 and serves as an isolation amplifier.

The output of the preamplifier 14 is compared to a reference voltage (in this case, zero volts) by a differential comparator 16. The differential comparator is a bi-level state circuit which has a high state when the input is below the reference voltage, and a low state when the input is equal to or greater than the reference voltage. The output of the comparator is applied to a level shifter circuit 17. The level shifter 17 has the output thereof applied to a switch 18 which, upon operation, recharges the capacitor 13 to a predetermined voltage.

As noted above, the discharge rate of the capacitor 13 is determined by the RC time constant of resistance 12 and capacitance 13 and thus the number of times the capacitor is discharged to a predetermined level in a predetermined time interval is a measure of the value of the resistance of resistor 12. In this respect it is again noted that the value of the capacitor 13 is held constant in this example. The aforementioned predetermined voltage level of capacitor 13 is set to ultimately operate the switching circuit 18 and thus each output pulse of the comparator 16 is, in fact, an indication of capacitor 13 having been discharged to the predetermined level. In accordance with the present invention the pulsed output of the comparator 16 is applied through the level shifter 17 and through a pulse conditioner 19 to an output terminal 21 where the pulses are counted over a predetermined time interval by a peripheral processor to thus provide a measure of the value of the resistance of resistor 12. It is noted that the switch 18 operates to substantially instantaneously recharge the capacitor 13 to a desired level, as further described below.

Appropriate conventional counting and calculating means are adapted to be connected to the output terminal 21 and the pulse conditioner serves to make the output pulses into suitable form and amplitude to operate such means and also possibly actuating mechanisms in accordance with predetermined measured or monitored resistance values.

Figure 2:
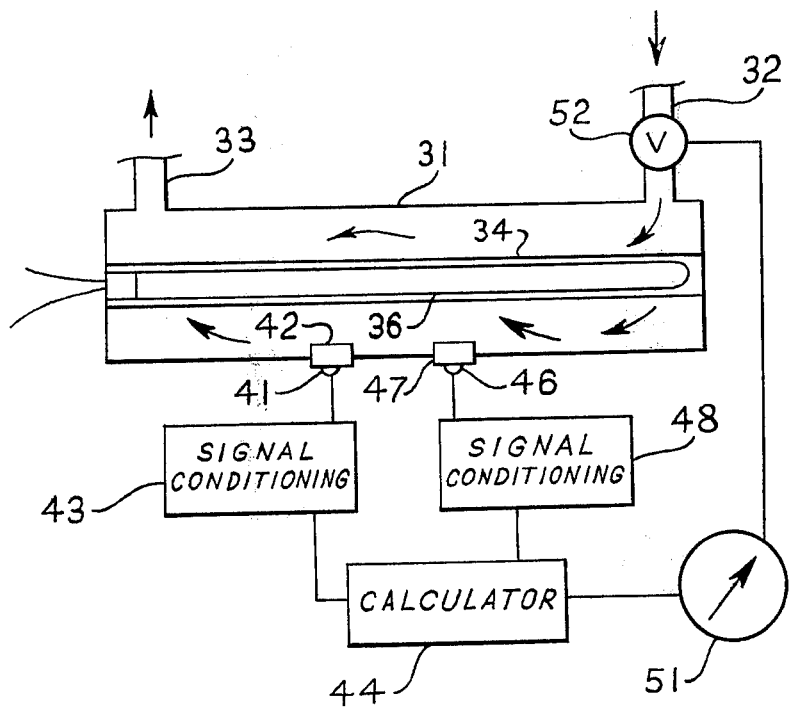
FIG. 2 is a schematic illustration of an ultraviolet light, water contamination monitoring and purification system incorporation the present invention.

The present invention may be employed in a wide variety of applications; however, for the purposes of illustration, there is schematically shown in FIG. 2 a water purification and contamination monitoring system employing this invention. The system of FIG. 2 may incorporate a tank 31 having an inlet line 32 and an outlet line 33 for the passage of a liquid such as water through the tank. Within the tank there is provided one or more ultraviolet-transparent hollow cylinders 34 formed, for example, of quartz glass, and having disposed therein an ultraviolet light emitter such as a mercury vapor lamp 36. Liquid flowing through the tank is thus subjected to ultraviolet radiation. It is noted that a system such as this is adapted to determine the contamination of liquid flowing through the tank 31 and also to purify the liquid by killing micro-organisms therein with ultraviolet radiation. Radiation in the wave length range of about 2540 angstroms has been determined to kill harmful micro-organisms in water utilized for human consumption, aquariums, hatcheries, chemical processing plants, and the like; however, a minimum dosage of radiation is required to ensure achievement of the desired microorganism destruction. With a predetermined rate of flow then, a minimum ultraviolet light dosage of 16,000 microwatt-seconds per square centimeter, for example, may be required to ensure the necessary purity of exiting water from the tank.

The system of FIG. 2 is provided with an ultraviolet light sensor 41 viewing the interior of the tank through a window 42 transparent to ultraviolet light for receiving ultraviolet light as attenuated by the liquid passing through the tank. The sensor 41 is connected to transducer signal conditioner circuitry, such as illustrated in FIG. 1 and indicated by the numeral 43 in FIG. 2, which produces output pulses having a frequency or repetition rate dependent upon the resistance of the sensor 41. As noted above, the sensor has the resistance thereof inversely varied by varying intensity of incident ultraviolet light and the pulses generated by the circuit 43 are then applied to a calculator, counter or processing circuit 44 to produce output counts or an analog voltage proportional to the ultraviolet light intensity impinging on the sensor. Different ultraviolet light sensors have different responses to visible light or light of other wave lengths and it may be desired to exclude the visible light response from the measured output of the system. To this end there is illustrated in FIG. 2 a second ultraviolet light sensor 46 which may be identical to the first sensor 41 but which views the interior of the tank adjacent to the first sensor through a regular glass window 47 or other material opaque to ultraviolet light. Thus only visible light from the tank may reach the sensor 46. This second sensor 46 is connected to a second transducer signal conditioning circuit 48, which may be the same as the first such circuit 43, to produce output pulses having a repetition rate determined by the resistance of the sensor as established only by visible light. The output of the circuit 48 is also applied to the processor 44 which in this instance incorporates means for alternately receiving, subtracting, and retaining the differential output of the two circuits 43 and 48. That is, the processor includes means for storing input pulses from the two comparators of the signal conditioning circuits for like periods of time, and subtracting the counter number of pulses per period from the comparator of circuit 48 from those of the comparator of circuit 43 to produce a pulse output representing only the intensity of ultraviolet light incident on sensor 41. Thus, the output signal of the processor is indeed a measure of only the ultraviolet light intensity.

The system of FIG. 2 may provide readout means such as a meter 51 operated by the output of the processor 44 and indicating the intensity of ultraviolet radiation passing through the liquid in the tank in terms of some convenient units so that an operator may be apprised of the contamination of liquid passing through the tank and also of the effectiveness of micro-organism destruction by ultraviolet radiation. Inasmuch as many applications of systems such as that illustrated and briefly described above have predetermined lower limits of ultraviolet intensity passing through liquid moving therethrough at a particular determined rate of flow, the system may also include a relay operated output connected to a valve 52 in the inlet or outlet of the tank so that the valve is automatically closed when the monitored or measured ultraviolet light intensity falls below a predetermined value. There may also be provided an audible alarm associated with the system in order to call attention of operating personnel to either an impending dangerous situation or a system shutdown.

Figure 3:
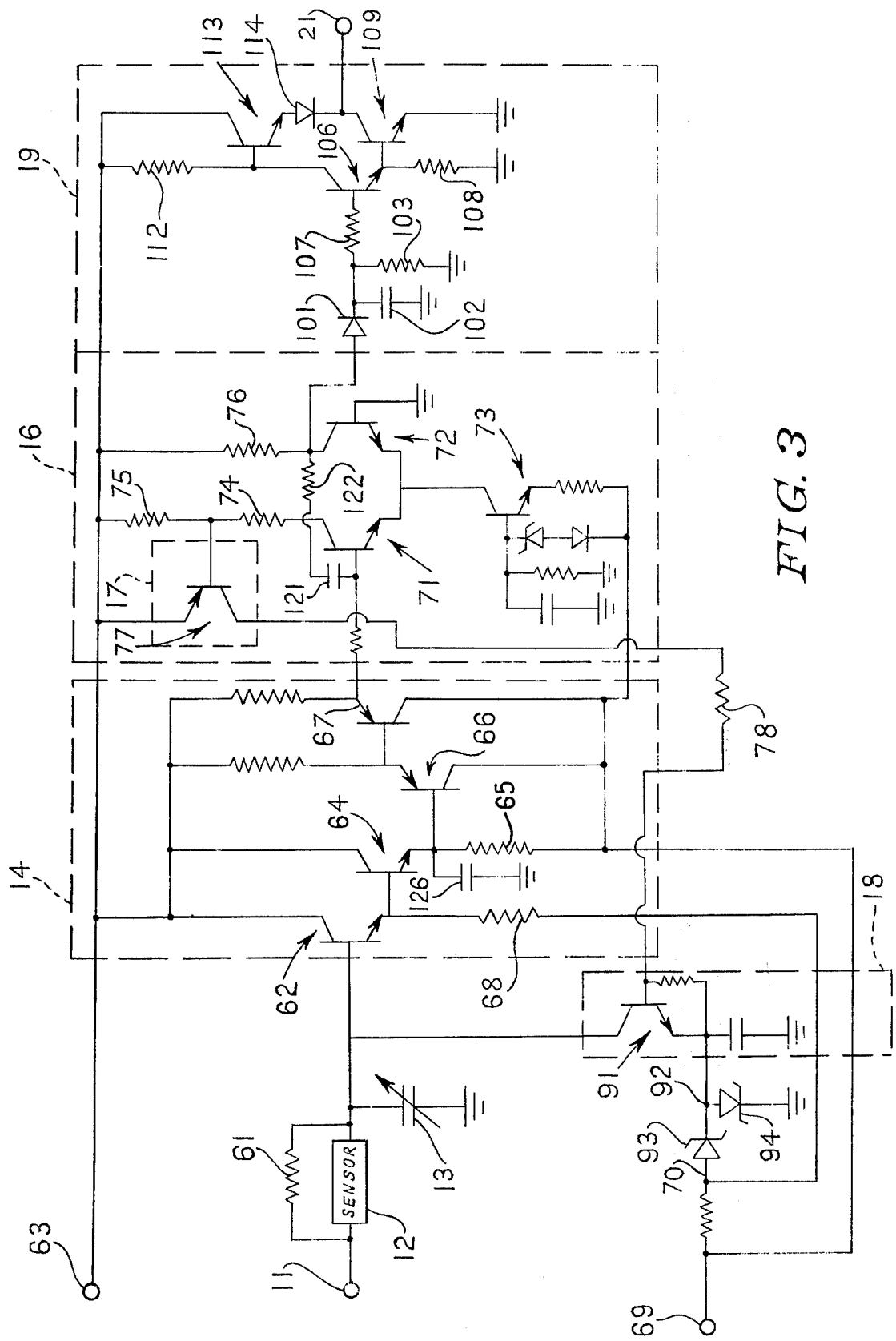
FIG. 3 is a circuit diagram of a circuit in accordance with the present invention.

Considering now the circuit of a preferred embodiment of the present invention in some detail, and referring to FIG. 3, it will be seen that the blocks of FIG. 1 are identified in dashed lines in the circuit of FIG. 3. The same reference numerals are applied to these blocks in both FIGS. 1 and 3. The variable resistance 12 of FIG. 1 as illustrated in FIG. 3 is an ultraviolet light sensor, such as described previously, and is connected between the power supply terminal 11 and the ungrounded side of the variable capacitor 13. A fixed resistor 61 of predetermined value is connected in parallel with the sensor 12. The capacitance of capacitor 13 is varied until the circuit operates at the desired pulse repetition rate for a particular parallel resistance of sensor 12 and resistor 61. This is accomplished with a predetermined amount of visible light only impinging upon the sensor 12. It is noted that the resistance of resistor 61 is much larger than that of sensor 12 under these conditions and within the normal operating range of ultraviolet light intensity. The purpose of the resistor 61 is to fix a maximum resistance and consequently a minimum pulse repetition rate. This is done to facilitate alignment and to eliminate certain undesired effects in the circuits following.

The preamplifier circuit 14 includes NPN transistors 62 and 64 and PNP transistors 66 and 67 with associated passive components, i.e., resistors and capacitors, and is temperature insensitive by virtue of the properties of NPN transistors 62 and 64 and PNP transistors 66 and 67 when connected as in the illustrated configuration. Under normal operations the emitter-base junction of an NPN transistor exhibits a decreasing emitter-base voltage as the temperature is raised. This causes the emitter voltages of 62 and 64 to become more positive for a given base forward bias voltage. On the other hand, a PNP transistor such as transistors 66 or 67 exhibits much the same characteristic only with all voltage polarities reversed (providing the transistors are made of the same material, e.g., silicon, and they are operating at close to the same junction temperatures). The net result is that all temperature related effects are essentially eliminated.

The preamplifier circuit 14 has the base of the first transistor 62 (a high $\beta$ at low collector current device) thereof connected to the junction of sensor 12 and capacitor 13 and the collector thereof connected to a positive power supply terminal 63. The emitter of transistor 62 is connected to the base of transistor 64, which has the collector thereof returned to power supply terminal 63. The emitter of transistor 64 is connected to the base of a PNP transistor 66, which has the emitter thereof connected to the base of a second PNP transistor 67. The emitters of transistors 66 and 67 are also resistively coupled to the positive power supply terminal 63 while the emitter of transistor 64 is resistively coupled through resistor 65 to a negative power supply terminal 69. The collectors of transistors 66 and 67 are directly connected to a power terminal 69. The emitter of transistor 62 is coupled to the negative power supply terminal 70 through a resistor 68.

The input transistors 62 of the preamplifier has an extremely high input impedance by design (Zin = beta X resistance 68) in order to minimize the loading of the sensor by the base of transistor 62 and to present a constant impedance to the sensor. Each successive stage of the preamplifier circuit 14 provides a downward directed impedance transformation towards the differential comparator circuit 16. It should be noted at this point that the preamplifier circuit 14 presents no phase shift to the comparator circuit 16. The input impedance of the comparator is low and changes nonlinearly. Neither nonlinear change in impedance nor the low impedance of the comparator can be tolerated by the sensor 12. A low impedance would completely "swamp out" sensor 12 and a nonlinear variation in impedance would cause an unpredictable variation in the pulse repetition rate. A further problem overcome by the preamplifier is that the sensor could not by itself supply sufficient current to drive the comparator reliably. Therefore, circuit 14 serves a dual function: first, it serves to isolate the sensor from the comparator to ensure proper operation of the sensor, and second, it supplies sufficient current to the comparator circuit 16 to ensure proper functioning of such circuit. As noted previously, the impedance at the base of transistor 62 is equal to the beta of this transistor multiplied by the resistance of resistor 68, the impedance at the base of transistor 64 is equal to the resistance of resistor 68, the impedance at the base of transistor 66 is equal to the resistance of a resistor 65, the impedance at the base of transistor 67 is equal to the resistance of the emitter resistor of transistor 66, and the input impedance to the differential comparator circuit 16 is equal to the resistance of the emitter resistor of transistor 67.

It is noted that the resistor 68 may be several megohms, while the resistance of the emitter resistor of transistor 67 may be several hundred to few thousand ohms. This reflects an impedance transformation of three to four orders of magnitude. Further, preamplifier curcuit 14 may be a linear amplifier as it is here, but this is not essential to the operation of the system; the circuit is only required to have a consistent and predictable output at the point when the capacitor 13 is fully discharged. Reyond this it is only required to vary in the same direction as the signal on capacitor 13, (as noted earlier, this means that the preamplifier does not invert the signal).

The output of the preamplifier curcuit 14 from the emitter of transistor 67 is connected to the input of the differential comparator circuit 16. The differential comparator includes two NPN transistors 71 and 72 having the emitters thereof connected together and to a constant current source 73 comprising a transistor, diodes and a resistor. In the illustrated circuit the base of transistor 72 is connected to ground to provide a zero voltage reference to the comparator. The base of transistor 72 may, however, be connected to any predetermined voltage, fixed or variable, depending on the application. The base of transistor 71 is resistively coupled to the output of the preamplifier circuit 14 at the emitter of transistor 67. As long as the voltage at the base of transistor 71 remains more negative than the base of transistor 72 (zero volts) transistor 71 is reverse biased and turned off. Thereafore, the voltage at the collector of transistor 71 which is resistively coupled through series resistors 74 and 75 to the positive supply terminal 63, remains at the potential of the positive supply terminal. Under these conditions transistor 72 is forward biased and turned on with the collector thereof connected through a resistor 76 to the positive supply terminal 63 and is at approximately -0.5 volts, indicating that the transistor is drawing all the available current from the constant current source 73. As soon as the output of the preamplifier reaches zero volts indicating that capacitor 13 is fully discharged, the condition of the comparator circuit 16 is reversed and transistor 71 is turned on while transistor 72 is turned off. This causes the collector voltage on transistor 71 to drop virtually instantaneously to -0.5 volts and the base of a level shifting transistor 77 connected to the junction of resistors 74 and 75, to become more negative than the emitter thereof, which is connected directly to power supply terminal 63. When transistor 71 conducts or goes from an off state to an on state, there is produced a voltage drop across resistor 75. As the voltage drop across resistor 75 attempts to exceed the emitter-base forward voltage drop requirements of level shifting transistor 77 of level shifter 17, which was previously turned off because of insufficient forward bias at the emitter-base junction, transistor 77 turns on and saturates. This means that the collector of transistor 77 is effectively connected to its emitter or to the positive power supply 63.

The level shifter 17 operates the switch 18 to recharge the capacitor as stated above and to this end the collector of level shifter transistor 77 is coupled by a resistor 78 to the base of a switching transistor 91 in the switch 18. The collector of switching transistor 91 is directly connected to the junction of capacitor 13 and sensor 12 and the emitter of this transistor is connected to a constant voltage line 92 maintained at a constant voltage by a Zener diode 94 to ground and through a second Zener diode 93 and a resistor to the negative power supply terminal 69. Saturated conduction of level shifter transistor 77 produced by the reversal of conditions of the differential comparator 16 causes the base of switching transistor 91 to be effectively connected through resistor 78 to the positive power supply terminal 63 so that switching transistor 91 turns on through the same mechanism as the level shifting transistor. This causes the capacitor 13 to be instantaneously recharged to the negative reference voltage at line 92. This condition of the capacitor 13 is transmitted through the preamplifier circuit 14 to the comparator circuit 16 causing the base of transistor 71 to again become reverse biased so the transistor 71 is turned off. The foregoing causes the level shifter transistor 77 to turn off in a like manner so that switching transistor 91 is turned off and capacitor 13 again commences to discharge. The above-described operation is cyclic and continues to repeat as long as the power supplies, sensor and capacitor are connected to the circuit. The number of cycles of charging and discharging of the capacitor 13 occurring in any fixed period of time is groverned solely by the time it takes to discharge the capacitor 13 through the rensor 12 in parallel with resistor 61 into the positive power supply terminal 11. It is believed apparent that, with a fixed voltage at supply terminal 11 and line 92 and a fixed value of capacitor 13, the only parameter that can vary the pulse repetition rate is the magnitude of the parallel combination of sensor 12 and resistor 61. It is furthermore evident that, with a fixed value of resistor 61, only the resistance of sensor 12 changes in response to radiation by ultraviolet and visible light. Consequently, the repetition rate or number of charges and discharges of the capacitor 13 in any fixed period of time is a measure of the change in resistance of sensor 12 in response to incident light.

The output pulses at the comparator 16 are normally too narrow to be conveniently transmitted and utilized by processing circuits that may be employed by the present invention. This results from the fact that each time transistor 71 turns on the other transistor 72 turns off to produce an extremely narrow positive going pulse. Consequently, there may be provided as a portion of the present invention a pulse conditioner circuit 19 fed from the collector of comparator transistor 72. the function of this conditioning circuit 19 is to widen the comparator pulse to a convenient width for easy transmission and further utilization. Additionally, the conditioner serves to isolate the comparator from an output cable and following processor circuitry that might otherwise affect operation of the comparator. The pulse conditioner circuit 19 includes a diode 101 coupling the collector of comparator transistor 72 to ground through parallel connected capacitor 102 and resistor 103 and to the base of a transistor 106 through a resistor 107. Transistor 106 has the emitter thereof grounded through a resistor 108 and connected to the base of a transistor 109 having the emitter thereof grounded and the collector thereof directly connected to the output terminal 21. The collector of transistor 106 is connected to the positive power supply terminal 63 through a resistor 112 and is directly connected to the base of a transistor 113 having the collector thereof directly connected to positive power supply terminal 63 and the emitter thereof connected through a diode 114 to the output terminal 21.

Considering now the operation of the pulse conditioner circuit 19, it is first noted that, when the collector of comparator transistor 72 goes positive, the capacitor 102 will be charged through the diode 101 by current flowing through resistor 76 from the positive power supply terminal 63. This positive voltage applied to the base of transistor 106 will turn on the transistor which, in turn, causes transistor 109 to conduct and generate a zero voltage signal on the output terminal 21. Reversal of the condition of the comparator circuit to turn on transistor 72 thereof returns the collectors of this transistor to -0.5 volts. However, capacitor 102 cannot discharge through transistor 72 because of the action of coupling diode 101. Capacitor 102 thus discharges through resistor 103. The resistance value of resistor 103 is made substantially larger than the resistance of resistor 76 so that the discharge time of capacitor 102 is much longer than the charging time thereof. As long as a charge on capacitor 102 is sufficient to maintain transistor 106 conducting, the output terminal of the pulse conditioner will remain at 0 volts. As soon as the capacitor 102 is sufficiently discharged through resistor 103, the transistor 106 is turned off or ceases to conduct, so that the transistor 109 is turned off and transistor 113 is turned on. This effectively connects the output terminal 21 to the positive power supply terminal 63 through the diode 114 to saturate the transistor 113. The following positive going output pulse from the comparator 16 repeats the foregoing cycle. It will be appreciated that the width or duration of the negative output pulse at terminal 21 may be readily designed as desired by employing appropriate values of resistor 76, capacitor 102 and resistors 103 and 107.

Various refinements and additions to the above-described circuitry may be incorporated herein and at least certain of these are illustrated in the drawing. Thus, for example, there will be seen to be provided in the circuit of FIG. 3 a series connected capacitor 121 and resistor 122 coupling the base of transistor 71 and collector of transistor 72. This resistance-capacitance circuit is employed as a positive feed back loop to increase the switching speed of the comparator circuit 16 in order to ensure that the charge upon capacitor 13 does not exceed 0 volts. As soon as the collector of comparator transistor 72 begins to go positive, as described above, a portion of that signal is fed back to the base of comparator transistor 71 in order to ensure fast switching.

These is also preferably provided as a portion of the present invention a parallel resistance-capacitance connection between the emitter of transistor 64 and the negative power supply terminal 69 in order to ensure that capacitor 13 is fully discharged by the switch circuit before allowing the switch circuit to be turned off. A capacitor 126 maintains a relatively positive voltage on the base of the preamplifier transistor 66 after the base of transistor 62 at the input of the preamplifier has been returned to a maximum predetermined negative potential. The capacitor 126 must discharge through the parallel resistor 65 before the output of the preamplifier reflects the change in condition of the preamplifier input. Thus, by choice of appropriate values of capacitor 127 and resistor 65, it is possible to ensure operation of the switching circuit for sufficient time to fully discharge the capacitor 13. It will be seen that this also slightly widens the output pulse from the preamplifier circuit and consequently also widens the output pulse at the output terminal 21 of the pulse conditioner.

There may also be provided as a portion of this present invention various bypass capacitors across power supply lines and the like for removing both low frequency and high frequency ripple from power supply voltage. Although at least certain of these capacitors are indicated, others may be provided in accordance with good circuit design techniques. Such capacitance connections are also helpful in eliminating ringing resulting from the very rapid operation of circuits herein.

It was noted above that at least most ultraviolet sensors, including the sensor adapted to be employed with the present invention, have a hyperbolic response wherein the output resistance decreases hyperbolically with increasing incident ultraviolet intensity. The present invention operates with a matched hyperbolic response so that the output of the present invention is linearly related to the intensity of incident ultraviolet radiation impinging upon the sensor. It is also noted that the resistance of the sensor is equal to some constant divided by the intensity of incident ultraviolet radiation. On the other hand, the frequency or pulse rate repetition of the present invention is equal to another constant divided by the resistance of the sensor times the capacitance of capacitor 13. With the value of capacitor 13 fixed during operation, this frequency is then equal to some third constant divided by the resistance of the sensor. However, with the resistance of the sensor equal to a first constant divided by intensity, this may be substituted in the latter relationship to reach the conclusion that the frequency of operaton of the present invention is equal to some fourth constant times the intensity of ultraviolet radiation incident upon the sensor. Consequently, prior problems of attempting to match a linear measuring circuit with a hyperbolically responsive sensor are entirely overcome hereby.

The circuit of the present invention may be used with any sensor or transducer that has a response to some physical quantity that is hyperbolic, i.e., is of the form $X = K/u$ where $X$ = the quantity to be measured, $k$ = constant of proportionality and $u$ may be either voltage, current, resistance, capacitance or inductance. The circuit may also be used with minor modification, such as cascading, to linearize an input signal that varies with the form $X = k_2/u^n$, where $n$ is an arbitrary integral exponent. It may also be used with a linearly varying input to generate a hyperbolic response or, by cascading, a response of an inverse power series. This would be applicable in areas where it is necessary to expand a very small change in a transducer or sensor output to a very large change in signal output in an environment where linear gain is impossible or impractical to achieve.

Figure 4:
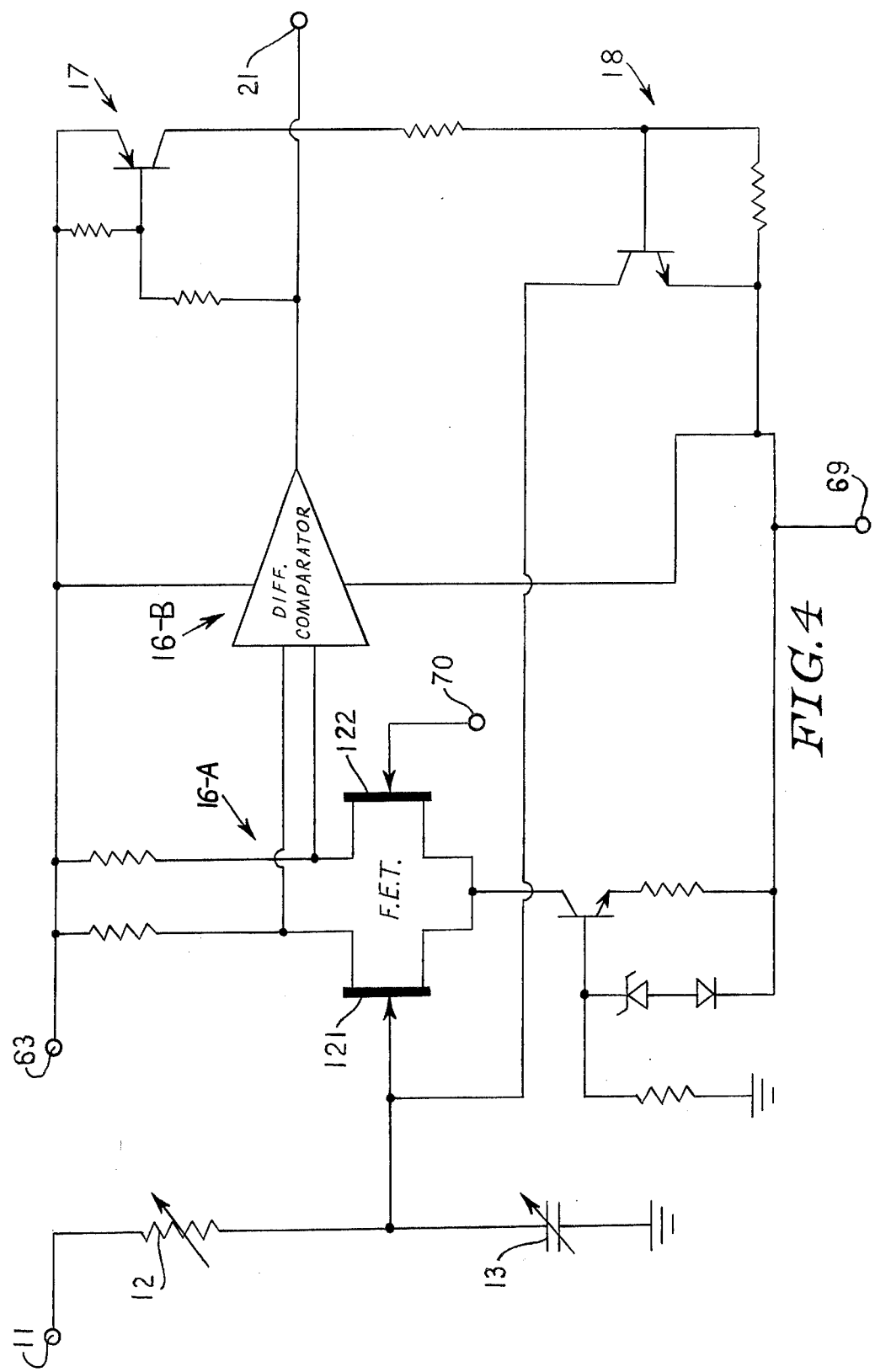
FIG. 4 is an alternative circuit configuration of the invention utilizing a pair of field-effect transistors to functionally synthesize several of the circuit stages.

In FIG. 4 there is illustrated alternative circuitry for the signal conditioner of the present invention. In this circuit there are employed field effect transistors 121 and 122 as a temperature compensated high-input impedance differential comparater 16-A. In the circuit of FIG. 4 the elements of FIG. 1 are provided with the same numbers as in such Figure and modifications to the circuit in FIG. 3 are primarily made in the interest of simplicity and reduced cost of manufacture. The circuit of FIG. 4 operates substantially the same as that of FIG. 3 to produce a temperature compensated pulse output at terminal 21 which is related to the resistance of the sensor 12 in the manner described above. There may, of course, be employed pulse conditioning circuitry with the circuit of FIG. 4 in order to accommodate output signals to following circuitry or utilization apparatus.

It will be appreciated that the present invention provides a marked improvement in transducer resistance or capacitance measurement. From the foregoing description it is believed apparent that the present invention operates equally well with either a fixed resistance in place of the sensor and the transducer varying the capacitance or, as described, with a fixed capacitance and a resistance varying sensor. It is the rate of charge of the capacitor which is determined hereby without the necessity of linearly amplifying the charging currents so that prior problems of measuring large variations in resistance or capacitances are also fully overcome by the present invention.

Although the present invention has been described in connection with ultraviolet light intensity measurment in water purification, the invention also has applicability in a wide variety of other fields. Some examples of other applications are:

A. Measurement of water or chemical resistance as a function of dissolved impurities, which exhibits a hyperbolic response.

B. Utilization of capacitive type microphones in a multi-channel sound system that requires extremely high frequency response and dynamic range. A capacitive microphone has a hyperbolic response; the capacitance $C = k/d$, where $k$ = dielectric constant and $d$ = distance between plates of capacitor.

C. Measurement of small changes in temperatures of the core a nuclear reactor. In a reactor the temperature must be monitored from a distance to prevent destruction of the sensor devices. This gives rise to extremely low output levels, that vary linearly with temperature; however, a small change in that temperature may year destruction of the core. This small change is extremely difficult to measure. The present invention may be employed to convert the small temperature change to a large indicated change.

D. Electrical conversion of the output of an aneroid barometer, by using the capacitance between the diaphragm and housing, to a linear accurate reading. The foregoing has application in weather monitoring, pressure monitoring and altitude measurements. Conventional methods employ a lever connected to the diaphragm which in turn controls a potentiometer-type transducer. The prior art method is mechanically complex and must be calibrated often to maintain accuracy. A simpler and more accurate approach can be realized by utilizing the signal conditioning circuit of the present invention.

There has been set forth above a description of a single preferred embodiment of the present invention; however, it will be apparent to those skilled in the art that variations and modifications in the showing may be made within the scope of the present invention. It is thus not intended to limit the present invention to the precise terms of description or details of illustration.

What is claimed is:

1. A transducer measurement circuit for an ultraviolet light sensor having high resistance which varies inversely with the intensity of ultraviolet light incident thereon comprising
    a capacitor connected to a first end of said sensor,
    a source of electrical power connected to a second end of said sensor whereby said capacitor is adapted to be discharged through the variable resistance of said sensor,
    a comparator circuit biased to conduct at a predetermined input voltage threshold and having an input connected to the juncture of said sensor and capacitor for initiating conduction of said comparator circuit at a capacitor voltage equal to said predetermined threshold voltage,
    a transistor switch connected across said capacitor and connected to said comparator circuit for conduction upon conduction of said comparator circuit to recharge said capacitor and thus turn off said comparator circuit and complete a feedback loop, whereby the output of said differential comparator circuit is a series of pulses, and
    processing means connected to the output of said comparator circuit for processing the pulses as a measure of sensor resistance.

2. The circuit of claim 1 further defined by a preamplifier circuit including at least two series connected transistors having substantially complementary temperature response characteristics connected between said comparator circuit and said juncture of said sensor and said capacitor.

3. The circuit of claim 1 further defined by a level shifting circuit connected to the output of said comparator circuit and to the input of said transistor switch for applying a switching signal to said switch.

4. The circuit of claim 3 further defined by pulse shaping and amplifying means connected between said comparator and said processing means for applying to said processing means pulses conditioned for ready processing and storage.

5. The circuit of claim 1 further defined by
    a second ultraviolet light sensor having a light filter opaque to ultraviolet light thereover for response only to light of other wave lengths,
    a second capacitor connected to a first end of said second sensor,
    a second source of electrical power connected to a second end of said second sensor,
    a second comparator circuit biased to conduct at a predetermined input voltage threshold and having an input coupled to the juncture of said second sensor and capacitor,
    a second transistor switch connected across said second capacitor and connected for conduction upon conduction of said comparator circuit, and
    said processing means including means for processing and storing input pulses from said first and second comparators for like periods of time and subtracting the counted number of pulses per period of said second comparator from the counted number of pulses per period of said first comparator to produce an output of pulses per unit time representing only the intensity of ultraviolet light incident upon said first sensor.

* * * * *